United States Patent
Kim et al.

(10) Patent No.: US 8,558,380 B2
(45) Date of Patent: Oct. 15, 2013

(54) STACK PACKAGE AND METHOD FOR MANUFACTURING THE SAME

(75) Inventors: Si Han Kim, Yongin-si (KR); Woong Sun Lee, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/365,473

(22) Filed: Feb. 3, 2012

(65) Prior Publication Data
US 2012/0205798 A1 Aug. 16, 2012

(30) Foreign Application Priority Data
Feb. 15, 2011 (KR) .................. 10-2011-0013237

(51) Int. Cl.
*H01L 23/498* (2006.01)
*H01L 21/56* (2006.01)

(52) U.S. Cl.
USPC ............ 257/737; 257/E23.068; 257/E21.502; 257/E23.144; 257/E23.142; 257/738; 257/778; 257/723; 257/777; 257/773; 257/774; 257/686; 257/685; 257/724; 257/725; 257/728; 257/734; 257/779; 257/780; 257/781; 438/109

(58) Field of Classification Search
USPC ......... 257/737, 738, 778, 723, 777, 773, 774, 257/686, 685, 724, 725, 728, 734, 779, 780, 257/781, E23.144, E23.142, 690, E21.502, 257/E23.068; 438/109
See application file for complete search history.

(56) References Cited

U.S. PATENT DOCUMENTS

2011/0186978 A1* 8/2011 Kim et al. .................. 257/686
2011/0309504 A1* 12/2011 Bae et al. .................. 257/738

FOREIGN PATENT DOCUMENTS

KR 2001061796 A * 7/2001

* cited by examiner

*Primary Examiner* — A O Williams
(74) *Attorney, Agent, or Firm* — William Park & Associates Patent Ltd.

(57) ABSTRACT

A semiconductor package includes a first semiconductor chip having first bumps which are projectedly formed thereon; a first copper foil attachment resin covered on the first semiconductor chip to embed the first semiconductor chip, and formed such that a first copper foil layer attached on an upper surface of the first copper foil attachment resin is electrically connected with the first bumps; a second copper foil attachment resin including a second copper foil layer which is electrically connected with the first copper foil layer, and disposed on the first copper foil attachment resin; and a second semiconductor chip embedded in the second copper foil attachment resin in such a way as to face the first semiconductor chip, and having second bumps formed thereon which are electrically connected with the second copper foil layer.

12 Claims, 3 Drawing Sheets

STACK PACKAGE AND METHOD FOR MANUFACTURING THE SAME

CROSS-REFERENCE TO RELATED APPLICATIONS

The present application claims priority to Korean patent application number 10-2011-0013237 filed on Feb. 15, 2011, which is incorporated herein by reference in its entirety.

BACKGROUND OF THE INVENTION

The present invention relates to a semiconductor package and a method for manufacturing the same, and more particularly, to a semiconductor package and a method for manufacturing the same which can simplify a process and reduce the manufacturing cost.

In the semiconductor industry, packaging technologies for integrated circuits have continuously been developed to satisfy the demand toward miniaturization and mounting reliability. For example, the demand toward miniaturization has expedited the development of technologies for a package with a size approaching to that of a chip. The demand toward mounting reliability has highlighted the importance of packaging technologies for improving the efficiency of mounting work, and mechanical and electrical reliability after mounting.

As miniaturization and high performance are demanded in electric and electronic products, various technologies for providing a semiconductor package with high capacity have been researched and developed. A method for providing a semiconductor package of high capacity includes the high integration of a memory chip. Such high integration can be realized by integrating an increased number of cells in a limited space of a semiconductor chip.

However, high integration of a memory chip requires high precision technologies, such as a fine line width, and a lengthy development period. Under these situations, a stacking technology has been suggested as another method for providing a semiconductor package of high capacity. The stacking technology is divided into a method of embedding two stacked chips in one package, and a method of stacking two separate packages which are independently packaged.

In the conventional art, a stacked package is realized by attaching a first semiconductor chip in a face-down manner to a main substrate and attaching a second semiconductor chip in a face-up manner to the first semiconductor chip. Another way of packaging two semiconductor chips is to attach both first and second semiconductor chips in a face-up manner to a main substrate.

However, when two chips are stacked on bottom of each other, a problem is caused in that a difference is caused between the speeds of electrical signals transmitted from the main substrate to the first and second semiconductor chips. When stacking two chips face up on a substrate, a problem occurs because the first semiconductor chip and the second semiconductor chip require redistribution processes, the number of processes increases and the manufacture costs are highly incurred.

BRIEF SUMMARY OF THE INVENTION

Embodiments of the present invention are directed to a semiconductor package and a method for manufacturing the same which can simplify a process and reduce manufacturing costs in the manufacture of a package.

In one embodiment of the present invention, a semiconductor package includes: a first semiconductor chip having first bumps which are projectedly formed thereon; a first copper foil attachment resin covered on the first semiconductor chip to embed the first semiconductor chip, and formed such that a first copper foil layer attached on an upper surface of the first copper foil attachment resin is electrically connected with the first bumps; a second copper foil attachment resin including a second copper foil layer which is electrically connected with the first copper foil layer, and disposed on the first copper foil attachment resin; and a second semiconductor chip embedded in the second copper foil attachment resin in such a way as to face the first semiconductor chip, and having second bumps formed thereon which are electrically connected with the second copper foil layer.

The semiconductor package may further include a first core layer disposed on a lower surface of the first copper foil attachment resin, and having a first surface to which the first semiconductor chip is attached and a second surface which faces away from the first surface.

The semiconductor package may further include: via patterns electrically connecting the first semiconductor chip with the first core layer.

The via patterns may be electrically connected with the first copper foil layer which is electrically connected with the first bumps, and may pass through the first surface and the second surface of the first core layer.

The via patterns may include copper.

The first core layer may include ball lands formed on the second surface of the first core layer and electrically connected with the via patterns.

The semiconductor package may further include external connection terminals formed on the ball lands.

The first and second bumps may include at least one of copper (Cu), silver (Ag), gold (Au), nickel (Ni) and tin (Sn).

The semiconductor package may further include a second core layer disposed on an upper surface of the second copper foil attachment resin in which the second semiconductor chip is embedded, and having a third surface to which the second semiconductor chip is attached and a fourth surface which faces away from the third surface.

In another embodiment of the present invention, a method for manufacturing a semiconductor package includes: preparing a first core layer having a first surface and a second surface which faces away from the one surface; attaching a first semiconductor chip to the one surface of the first core layer; forming first bumps on the first semiconductor chip to project from an upper surface of the first semiconductor chip; covering a first copper foil attachment resin on the first surface of the first core layer such that the first semiconductor chip is embedded in the first copper foil attachment resin and a first copper foil layer formed on an upper surface of the first copper foil attachment resin is electrically connected with the first bumps; forming via patterns in holes which pass through the first copper foil layer, the first copper foil attachment resin and the first surface and the second surface of the first core layer in such a way as to electrically connect with the first copper foil layer electrically connected with the first bumps of the first semiconductor chip which are projectedly formed; preparing a second core layer having a third surface which faces the one surface of the first core layer and a fourth surface which faces away from the third surface; attaching a second semiconductor chip to the third surface of the second core layer; forming second bumps on the second semiconductor chip to project from an upper surface of the second semiconductor chip; covering a second copper foil attachment resin on the third surface of the second core layer such that the second semiconductor chip is embedded in the second copper foil attachment resin and a second copper foil layer formed on an upper surface of the second copper foil attachment resin is electrically connected with the second bumps; and attaching the second copper foil attachment resin formed the second copper foil layer on the upper surface thereof, embedded the second semiconductor chip within, and covered the third surface of the second core layer, over the first copper foil attachment resin including the first core layer, such that the first bumps and the second bumps are electrically connected with each other.

The first and second bumps may include at least one of copper (Cu), silver (Ag), gold (Au), nickel (Ni) and tin (Sn).

The via patterns may include copper.

The first core layer may include ball lands formed on the second surface thereof and electrically connected with the via patterns.

The method may further include forming external connection terminals on the ball lands.

Another embodiment includes a semiconductor package comprising a first semiconductor chip embedded in a first copper foil attachment resin. A second semiconductor chip embedded in a second copper foil attachment resin. Where the first semiconductor chip is electrically connected to the second semiconductor chip via at least one bump and at least one copper foil layer.

The at least one bump comprises a first bump projectedly formed on the first semiconductor chip and a second bump projectedly formed on the second semiconductor chip. The at least one copper foil layer comprises a first copper foil layer formed on an upper surface of the first copper foil attachment resin and is electrically connected with the first bumps, and a second copper foil layer formed on lower surface of the second copper foil attachment resin, electrically connected with the first copper foil layer, and disposed on the first copper foil layer.

The semiconductor package may further comprises a first core layer disposed on a lower surface of the first copper foil attachment resin, and having a first surface to which the first semiconductor chip is attached and a second surface which faces away from the first surface, and a second core layer disposed on an upper surface of the second copper foil attachment resin, and having a third surface to which the second semiconductor chip is attached and a fourth surface which faces away from the third surface.

Still further, the semiconductor package may comprise via patterns electrically connecting the first semiconductor chip with the first core layer, and the via patterns may be electrically connected with the first copper foil layer which is electrically connected with the first bumps, and pass through the first core layer.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
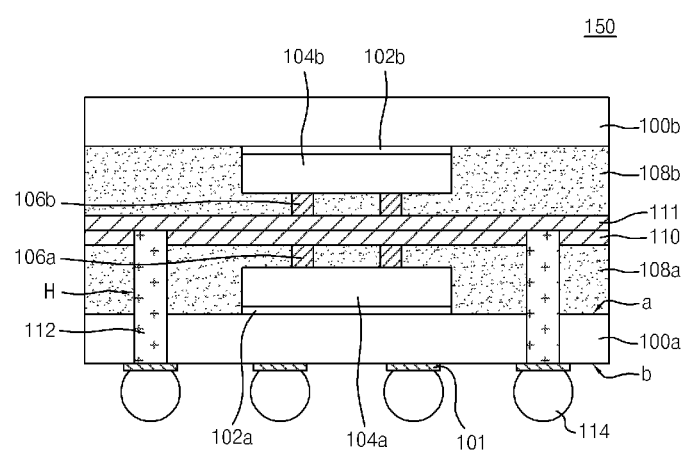
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, the semiconductor package 150 in accordance with an embodiment of the present invention includes a first semiconductor chip 104a, a first copper foil layer 110, a first copper foil attachment resin 108a, a second copper foil layer 111, a second copper foil attachment resin 108b, and a second semiconductor chip 104b. In addition, the semiconductor package 150 in accordance with an embodiment of the present invention further includes a first core layer 100a, a second core layer 100b, via patterns 112, ball lands 101, and external connection terminals 114.

In detail, the first core layer 100a has a first surface a and a second surface b which faces away from the first surface a, and the ball lands 101 are formed on the second surface b. The external connection terminals 114, for example, such as solder balls, are formed on the ball lands 101.

The first semiconductor chip 104a is attached to the first surface a of the first core layer 100a by the medium of a first adhesive 102a, and the first semiconductor chip 104a is formed with bonding pads (not shown) in a face-up manner. First bumps 106a are projectedly formed on the bonding pads. The first bumps 106 may include, for example, at least one of copper (Cu), silver (Ag), gold (Au), nickel (Ni) and tin (Sn).

The first copper foil attachment resin 108a covers the first semiconductor chip 104a in such a way as to embed the first semiconductor chip 104a.

The first copper foil layer 110 is formed on the upper surface of the first copper foil attachment resin 108a in such a way as to be electrically connected with the first bumps 106a. The first copper foil layer 110 may include, for example, copper.

In an embodiment of the present invention, the first copper foil attachment resin 108a and the first copper foil layer 110 are collectively referred to as, for example, a resin coated copper (RCC).

In succession, the second copper foil layer 111 is disposed on the first copper foil layer 110 and is electrically connected with the first copper foil layer 110.

The second copper foil attachment resin 108b is disposed on the second copper foil layer 111.

The second semiconductor chip 104b is embedded in the second copper foil attachment resin 108b in such a way as to face the first semiconductor chip 104a, and the second semiconductor chip 104b has second bumps 106b which are projectedly formed and the second bumps 106b are electrically connected with the second copper foil layer 111. The second bumps 106b may include, for example, at least one of Cu, Ag, Au, Ni and Sn.

The via patterns 112 electrically connect the first semiconductor chip 104a and the first core layer 100a with each other. In detail, the via patterns 112 are electrically connected with the first copper foil layer 110 which is electrically connected with the first bumps 106a projectedly formed on the first semiconductor chip 104a, and the via patterns 112 pass through the first surface a and the second surface b of the first core layer 100a. The reference symbol H designates holes in which the via patterns 112 are formed.

As is apparent from the above descriptions, in an embodiment of the present invention, advantages are provided in that, since semiconductor chips are embedded in copper foil attachment resins including copper foil layers and the semiconductor chips may be electrically connected, it is possible to omit redistribution processes or bump forming processes which are otherwise performed additionally to electrically connect the semiconductor chips. Through this, in the embodiment of the present invention, processes may be simplified in the manufacture of a package and the manufacturing costs may be reduced.

FIGS. 2A to 2D are cross-sectional views explaining a method for manufacturing a semiconductor package in accordance with another embodiment of the present invention.

Figure 2A:
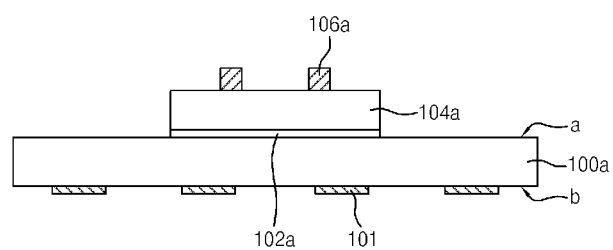
FIGS. 2A to 2D are cross-sectional views explaining a method for manufacturing a semiconductor package in accordance with an embodiment of the present invention.

Referring to FIG. 2A, a first core layer 100a having a first surface a and a second surface b facing away from the first surface a is prepared. Metal layers, for example, such as of copper, are formed on the one surface a and the other surface b of the first core layer 100a, and the metal layers may be patterned in a subsequent process to be formed into circuit patterns which may be electrically connected. For example, by patterning the metal layer on the second surface b of the first core layer 100a, ball lands 101 are formed. The ball lands 101 are formed to ease electrical connection to external connection terminals which are described later.

A first semiconductor chip 104a is attached to the first surface a of the first core layer 100a by the medium of a first adhesive 102a. The first semiconductor chip 104a has bonding pads (not shown) of a face-up type, and first bumps 106a are projectedly formed on the bonding pads. In one example, the first bumps may include at least one of Cu, Ag, Au, Ni and Sn.

Figure 2B:
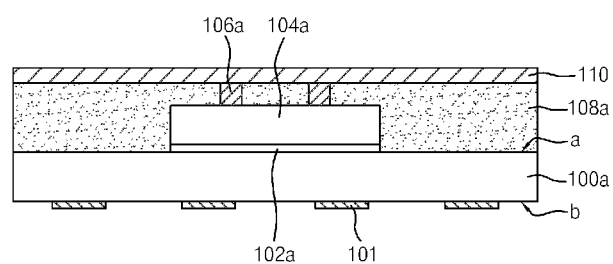

Referring to FIG. 2B, a first copper foil attachment resin 108a is covered on the first surface of the first core layer 100a such that the first semiconductor chip 104a is embedded in the first copper foil attachment resin 108a. A first copper foil layer 110, formed on the upper surface of the first copper foil attachment resin 108a, is electrically connected with the first bumps 106a.

In order to facilitate easy understanding of the present embodiment, the first copper foil attachment resin 108a and the first copper foil layer 110 are collectively referred to as, for example, a resin coated copper (RCC).

Figure 2C:
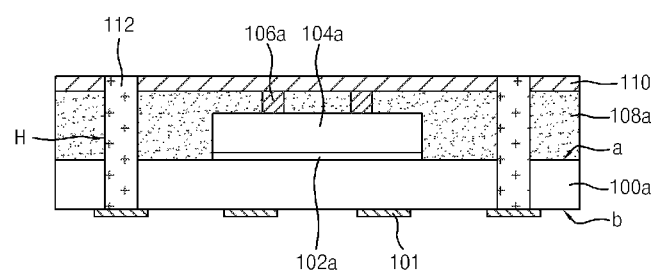

Referring to FIG. 2C, holes H may be formed through a drilling process. The holes H may be defined to pass through the first copper foil layer 110, the first copper foil attachment resin 108a and the first surface a and the second surface b of the first core layer 100a, in such a way as to expose the ball lands 101. Thereafter, via patterns 112 are formed in the holes H in such a way as to electrically connect the first copper foil layer 110 including the first bumps 106a with the ball lands 101.

Figure 2D:
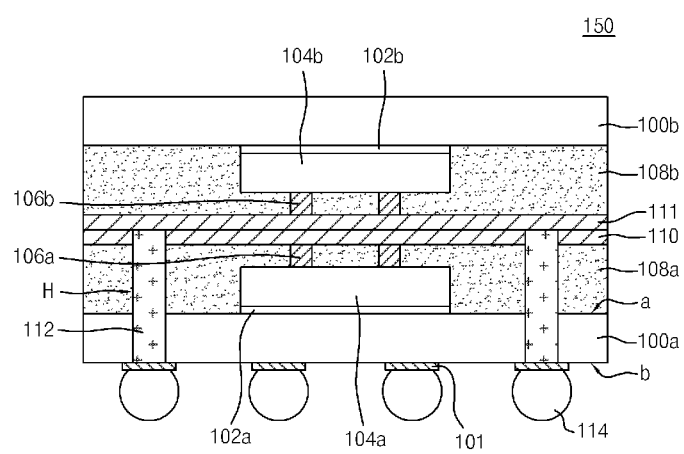

Referring to FIG. 2D, a second semiconductor chip 104b having second bumps 106b, a second copper foil attachment resin 108b, a second copper foil layer 111 and a second core layer 100b, which are similar to and correspond to the constructions of the first semiconductor chip 104a having the first bumps 106a, the first copper foil attachment resin 108a and the first core layer 100a, are disposed over the first semiconductor chip 104a having the first bumps 106a, the first copper foil attachment resin 108a, the first copper foil layer 110 and the first core layer 100a formed with the via patterns 112.

The second core layer 100b, having a third surface which faces the first surface a of the first core layer 100a and a fourth surface which faces away from the third surface, is prepared. Next, the second semiconductor chip 104b, having the second bumps 106b which are projectedly formed, is attached to the third surface of the second core layer 100b by a medium of a second adhesive 102b. The second bumps 106b may include, for example, at least one of Cu, Ag, Au, Ni and Sn.

The second copper foil attachment resin 108b including the second copper foil layer 111 which is formed on the upper surface thereof is covered on the third surface of the second core layer 100b such that the second semiconductor chip 104b is embedded in the second copper foil attachment resin 108b and the second copper foil layer 111 formed on the upper surface of the second copper foil attachment resin 108b is electrically connected with the second bumps 106b.

Next, the second copper foil attachment resin 108b formed the second copper foil layer 111 on the upper surface thereof, embedded the second semiconductor chip 104b within, and covered the third surface of the second core layer 100b, over the first copper foil attachment resin 108a including the first copper foil layer 110, for example, through surface treatment processing and thermal compression processing, such that the first bumps 106a and the second bumps 106b are electrically connected with each other through the first and second copper foil layers 110 and 111.

External connection terminals 114, for example, such as solder balls, are attached to the ball lands 101.

As is apparent form the above descriptions, in an embodiment of the present invention, advantages are provided in that, since the first and second semiconductor chips 104a and 104b are embedded in the first and second copper foil attachment resins 108a and 108b, and the first and second semiconductor chips 104a and 104b are electrically connected by the first and second copper foil layers 110 and 111, it is possible to omit redistribution processes or bump forming processes which are otherwise performed additionally to electrically connect the first and second semiconductor chips 104a and 104b.

Through this, in embodiments of the present invention, advantages are provided in that processes may be simplified in the manufacture of a package and manufacturing costs may be reduced.

Although specific embodiments of the present invention have been described for illustrative purposes, those skilled in the art will readily appreciate that various modifications, additions and substitutions are possible, without departing from the scope and the spirit of the invention as disclosed in the accompanying claims.

What is claimed is:
1. A stack package comprising:
a first semiconductor chip having first bumps which are projectedly formed thereon;
a first copper foil attachment resin covered on the first semiconductor chip to embed the first semiconductor chip, and formed such that a first copper foil layer formed on an upper surface of the first copper foil attachment resin is electrically connected with the first bumps;
a second copper foil attachment resin including a second copper foil layer which is electrically connected with the first copper foil layer, and disposed on the first copper foil attachment resin;
a second semiconductor chip embedded in the second copper foil attachment resin in such a way as to face the first semiconductor chip, and having second bumps formed thereon which are electrically connected with the second copper foil layer;
a first core layer disposed on a lower surface of the first copper foil attachment resin, and having a first surface to which the first semiconductor chip is attached and a second surface which faces away from the first surface;
a second core layer disposed on an upper surface of the second copper foil attachment resin in which the second semiconductor chip is embedded, and having a third surface to which the second semiconductor chip is attached and a fourth surface which faces away from the third surface; and via patterns electrically connecting the first semiconductor chip with the first core layer;

wherein the via patterns are electrically connected with the first copper foil layer which is electrically connected with the first bumps, and pass through the first surface and the second surface of the first core layer without passing through the second core layer.

2. The stack package according to claim 1, wherein the via patterns include copper.

3. The stack package according to claim 1, wherein the first core layer comprises ball lands formed on the second surface thereof and electrically connected with the via patterns.

4. The stack package according to claim 3, further comprising:

external connection terminals formed on the ball lands.

5. The stack package according to claim 1, wherein the first and second bumps include at least one of copper (Cu), silver (Ag), gold (Au), nickel (Ni) and tin (Sn).

6. A method for manufacturing a stack package, comprising:

preparing a first core layer having a first surface and a second surface which faces away from the one surface;

attaching a first semiconductor chip to the first surface of the first core layer;

forming first bumps on the first semiconductor chip to project from an upper surface of the first semiconductor chip;

covering a first copper foil attachment resin on the first surface of the first core layer such that the first semiconductor chip is embedded in the first copper foil attachment resin and a first copper foil layer formed on an upper surface of the first copper foil attachment resin is electrically connected with the first bumps;

forming via patterns in holes which pass through the first copper foil layer, the first copper foil attachment resin and the first surface and the second surface of the first core layer in such a way as to electrically connect with the first copper foil layer electrically connected with the first bumps of the first semiconductor chip which are projectedly formed;

preparing a second core layer having a third surface which faces the first surface of the first core layer and a fourth surface which faces away from the third surface;

attaching a second semiconductor chip to the third surface of the second core layer;

forming second bumps on the second semiconductor chip to project from an upper surface of the second semiconductor chip;

covering a second copper foil attachment resin on the third surface of the second core layer such that the second semiconductor chip is embedded in the second copper foil attachment resin and a second copper foil layer formed on an upper surface of the second copper foil attachment resin is electrically connected with the second bumps; and attaching the second copper foil attachment resin formed the second copper foil layer on the upper surface thereof, embedded the second semiconductor chip within, and covered the third surface of the second core layer, over the first copper foil attachment resin including the first core layer, such that the first bumps and the second bumps are electrically connected with each other.

7. The method according to claim 6, wherein the first and second bumps include at least one of copper (Cu), silver (Ag), gold (Au), nickel (Ni) and tin (Sn).

8. The method according to claim 6, wherein the via patterns include copper.

9. The method according to claim 6, wherein the first core layer comprises ball lands formed on the second surface thereof and electrically connected with the via patterns.

10. The method according to claim 9, further comprising:

forming external connection terminals on the ball lands.

11. A stack package comprising:

a first semiconductor chip embedded in a first copper foil attachment resin;

a second semiconductor chip embedded in a second copper foil attachment resin;

wherein the first semiconductor chip is electrically connected to the second chip via at least one bump and at least one copper foil layer, wherein the at least one bump comprises a first bump projectedly formed on the first semiconductor chip and a second bump projectedly formed on the second semiconductor chip, wherein the at least one copper foil layer comprises a first copper foil layer formed on an upper surface of the first copper foil attachment resin and is electrically connected with the first bumps, and a second copper foil layer attached on lower surface of the second copper foil attachment resin, electrically connected with the second bumps and the first copper foil layer, and disposed on the first copper foil layer, a first core layer disposed on a lower surface of the first copper foil attachment resin, and having a first surface to which the first semiconductor chip is attached and a second surface which faces away from the first surface;

a second core layer disposed on an upper surface of the second copper foil attachment resin, and having a third surface to which the second semiconductor chip is attached and a fourth surface which faces away from the third surface; and via patterns electrically connecting the first semiconductor chip with the first core layer, wherein the via patterns are electrically connected with the first copper foil layer which is electrically connected with the first bumps, and pass through the first surface and the second surface of the first core layer without passing through the second core layer.

12. The stack package according to claim 11, further comprising:

ball lands formed on the second surface of the core layer and electrically connected with the via patterns.

* * * * *